US006692972B1

(12) United States Patent
Yershov et al.

(10) Patent No.: US 6,692,972 B1
(45) Date of Patent: Feb. 17, 2004

(54) DEVICE FOR PRODUCING MICROSCOPIC ARRAYS OF MOLECULES, A METHOD FOR PRODUCING MICROSCOPIC ARRAYS OF MOLECULES

(75) Inventors: Gennadiy M. Yershov, Hinsdale, IL (US); Alexander I. Belgovskiy, Mayfield Heights, OH (US); Andrei D. Mirzabekov, Darien, IL (US)

(73) Assignee: University of Chicago, Chicago, IL (US)

( * ) Notice: Subject to any disclaimer, the term of this patent is extended or adjusted under 35 U.S.C. 154(b) by 76 days.

(21) Appl. No.: 09/645,246

(22) Filed: Aug. 24, 2000

(51) Int. Cl.[7] ................................................. G01N 1/10
(52) U.S. Cl. .................. 436/180; 436/174; 436/179; 422/63; 422/67; 422/99; 422/100; 422/104
(58) Field of Search ................ 422/62–67, 99, 422/100, 102–104; 436/43, 50, 54, 174, 179, 180; 73/863, 863.01, 863.11, 864.14, 864.31

(56) References Cited

U.S. PATENT DOCUMENTS

| | | | | |
|---|---|---|---|---|
| 5,498,545 A | * | 3/1996 | Vestal ........................ 436/47 |
| 5,750,881 A | * | 5/1998 | Dorenkott et al. ............. 73/37 |
| 5,853,894 A | * | 12/1998 | Brown ....................... 428/422 |
| 5,985,214 A | * | 11/1999 | Stylli et al. .................... 422/65 |
| 6,024,925 A | * | 2/2000 | Little et al. ................. 422/100 |
| 6,044,876 A | * | 4/2000 | Ally et al. .................... 141/130 |
| 6,051,190 A | * | 4/2000 | Birch et al. ................. 422/100 |
| 6,054,326 A | * | 4/2000 | Dubus ........................ 436/180 |
| 6,063,339 A | * | 5/2000 | Tisone et al. ................. 422/67 |
| 6,090,251 A | * | 7/2000 | Sundberg et al. ........... 204/453 |
| 6,101,946 A | * | 8/2000 | Martinsky .................... 101/494 |
| 6,148,666 A | * | 11/2000 | Roesicke .................. 73/290 R |
| 6,150,173 A | * | 11/2000 | Schubert ...................... 436/43 |
| 6,225,061 B1 | * | 5/2001 | Becker et al. ................. 435/6 |

* cited by examiner

*Primary Examiner*—Jill Warden
*Assistant Examiner*—Dwayne K Handy
(74) *Attorney, Agent, or Firm*—Cherskov & Flaynik

(57) ABSTRACT

A device for producing microscopic arrays of molecules is provided, the device comprising a plurality of inverted cavities containing solutions, a substrate adapted to be received by the cavities for extracting the solutions, a substrate for depositing the extracted solutions onto a location on a matrix; and a quality control monitoring system for verifying that the solutions are deposited onto the location on the matrix. A process for producing an array of molecules also is provided, the process comprising providing a plurality of inverted solution cavities, wherein each cavity contains a solution; extracting each solution from its respective inverted cavity; loading each solution at a predetermined position in an array; and verifying that each solution is loaded onto its respective position in the array.

30 Claims, 5 Drawing Sheets ized arrays. As such,
DEVICE FOR PRODUCING MICROSCOPIC ARRAYS OF MOLECULES, A METHOD FOR PRODUCING MICROSCOPIC ARRAYS OF MOLECULES

CONTRACTUAL ORIGIN OF THE INVENTION

The United States Government has rights in this invention pursuant to Contract Number W-31-109-ENG-38 between the United States Government and Argonne National Laboratory.

BACKGROUND OF THE INVENTION

1. Field of the Invention

This invention relates to a device and a method for producing arrays of molecules, and more specifically, the invention relates to a device and a method for transporting specific molecules in a solution and precisely loading the molecules onto an array configuration while minimizing contamination.

2. Background of the Invention

Subjecting a specific reactant for analysis to an array of chemicals is accomplished in a myriad of ways. For many wet-bench analyses, wherein macroscopic quantities are utilized, a simple test tube rack or microwell plate is suitable. When microscopic quantities are manipulated, for example in forensic situations, micro-pipettes techniques are utilized. When very small quantities are handled, automated systems are required.

The use of arrays of oligonucleotides is known for oligonucleotide sequencing activities and allele detection. A myriad of ways for producing the arrays also is known, including U.S. Pat. No. 5,756,050, awarded to the instant Assignee on May 26, 1998, and U.S. Pat. No. 5,962,329, awarded to the instant Assignee on Oct. 5, 1999. Both patents are incorporated herein by reference.

Generally, a solution well is accessed via a small diameter pin wherein fluid adhesion causes an amount of fluid to attach to the pin for subsequent transfer to an absorbent array cell.

Several quality control drawbacks exist with present systems used to load arrays. First, inasmuch as extremely small amounts of oligo-solution are loaded at the end of the transfer pins, evaporation during initial pin loading or transfer occurs. Evaporation from the oligonucleotide supply wells also occurs, which can lead to a change in oligo-concentration ultimately loaded into array cells. And the potential for contamination of the wells exists due to ever-settling microscopic debris in the air. The above problems are exacerbated inasmuch as present systems lack the means for quickly and immediately assessing the degree to which the correct solutions are loaded onto a specific position on the array.

Another drawback with current configurations is the lack of precision caused by the inability to align the various components of the arraying system quickly and in real-time. Yet another drawback is the lack of a built-in ability to have a flexible system to respond to both adjustments in template design and in specific location of particular solutions or molecules on the loaded array.

As a result of the foregoing, oligo-pin loading and transfer operations must occur in humidity controlled environs and also in extremely clean environments. Also, the solution-loading and solution-transfer operations of state-of-the-art systems cannot deviate from a rigid template protocol. The lack of precision of current aligning equipment prevents solution loading onto microscopic sized arrays. As such, substantial duplication loadings of particular array regions are necessary.

Furthermore, despite the provision of such elaborate transfer rooms, quality control of the resulting oligo-loaded arrays also suffers due to mechanical anomalies of the transfer process. For instance, after only a few transfers, the extremely delicate transfer pins often bend, leading to cross contamination with neighboring array cells. Furthermore, the height of the pin tips may vary due to some pin lengths being either too long or short, resulting in inconsistent pin contact with matrix-cell locations. This inconsistency may deform the oligo-matrix contact points or cause in-complete loading of the oligo from the pin to the matrix cell.

A need exists in the art for a device and method for maintaining, confirming and documenting quality control of oligonucleotide-loading procedures onto a matrix. The device and method should obviate the need for elaborate environmental control requirements but be simple in design and operation. In addition, the device should be easy to maintain in a clean and precise working order.

SUMMARY OF THE INVENTION

It is an object of the present invention to provide a device and method for producing arrays of molecules that overcome many of the disadvantages of the prior art.

Another object of the present invention is a device for manufacturing arrays of molecules. A feature of the device is that an ultimate user can remotely operate the device and design the array. An advantage of the invention is the elimination of errors in processing customer orders and rapid turn-around of customer orders for customized biochips.

Still another object of the present invention is to provide a device for accurately transferring aqueous solutions from a reservoir to a position on a microscopic matrix. A feature of the invention is the utilization of a temperature controlled system and gravity-induced systems, the systems including an inverted oligonucleotide reservoir and a gravity fed-washing system. An advantage of the invention is that evaporation from the solution reservoir and solution transport vehicles is minimized, as is contamination of the reservoir from air-borne debris.

Another object of the present invention is to provide an automated method for producing micro arrays of molecules. A feature of the invention is the user's active, on-line instruction in preparing the array via software driven robots. An advantage of the invention is the elimination of errors in processing customer orders and rapid turn around of the orders.

Yet another object of the present invention is to provide a method for transporting solutions, such as oligonucleotides in an aqueous mixture, from an oligonucleotide reservoir to a matrix. A feature of the invention is the utilization of gravity and capillary action to facilitate oligonucleotide loading and unloading from an oligo-transport vehicle. An advantage of the invention is the elimination of evaporation from the reservoir, the elimination of inadvertent contamination of the reservoir from ambient debris, and of elimination of positive pressure washing systems of the oligo-transport vehicle.

Another object of the present invention is to provide an automated method and device for transferring microscopic quantities of solution to microscopic array positions. A feature of the invention is the utilization of real-time quality control processes to monitor the adequacy of matrix cell loading. Another feature of the invention is the archiving of quality control images. An advantage of the invention is that the number of rejections of biochips due to improper loading are minimized. Another advantage is that archival information can be utilized by end-users to ascertain whether matrix image anomalies are due to cell loading histories or to the actual reactants being scrutinized.

Briefly, the invention provides a device for producing microscopic arrays of molecules, the device comprising a plurality of inverted cavities containing solutions; a means for extracting solutions from the inverted cavities; a means for depositing the extracted solutions onto an addressable location on a matrix; a means for verifying that the solutions are deposited onto the location on the matrix; and a means for storing the verification information so that the information can be subsequently retrieved.

Also provided is a process for producing -an array of nucleotides, the process comprising providing a plurality of inverted solution cavities, wherein each cavity contains an oligonucleotide solution having a different specific base sequence; extracting each oligonucleotide solution from the inverted cavity while the cavities are maintained in an inverted position; loading each oligonucleotide solution at a predetermined position in an array; and verifying that each oligonucleotide is loaded onto its respective position in the array.

BRIEF DESCRIPTION OF THE DRAWING

The present invention together with the above and other objects and advantages may best be understood from the following detailed description of the embodiment of the invention illustrated in the drawing, wherein.

DETAILED DESCRIPTION OF THE PREFERRED EMBODIMENT

The invention provides a device and method for precise and repeatable transport of molecules from a reservoir to predetermined locations or cells in a template matrix. The invention is comprised of subsystems which are integrated to provide the quality control and precision heretofore not seen in micro-scale solutions array manufacturing. These subsystems are as follows:

1. A solutions transferring subsystem comprising a pin array assembly, a washing subsystem, a template chip holder, a holder for a solutions reservoir, and a positioning subsystem. This system can be manually aligned using a three-point alignment technique;
2. A temperature control subsystem;
3. A quality control subsystem; and
4. An ordering subsystem comprising a data management system and a loading solutions management subsystem.

Generally, the invention provides a system and method for maintaining extremely high quality control during solution transfer and deposition operations. Several robotics subsystems and databases interact to facilitate remote third party designing and ordering of the custom manufactured matrices of chemicals, such as oligonucleotide matrices or matrices of other biochemicals.

Figure 1A:
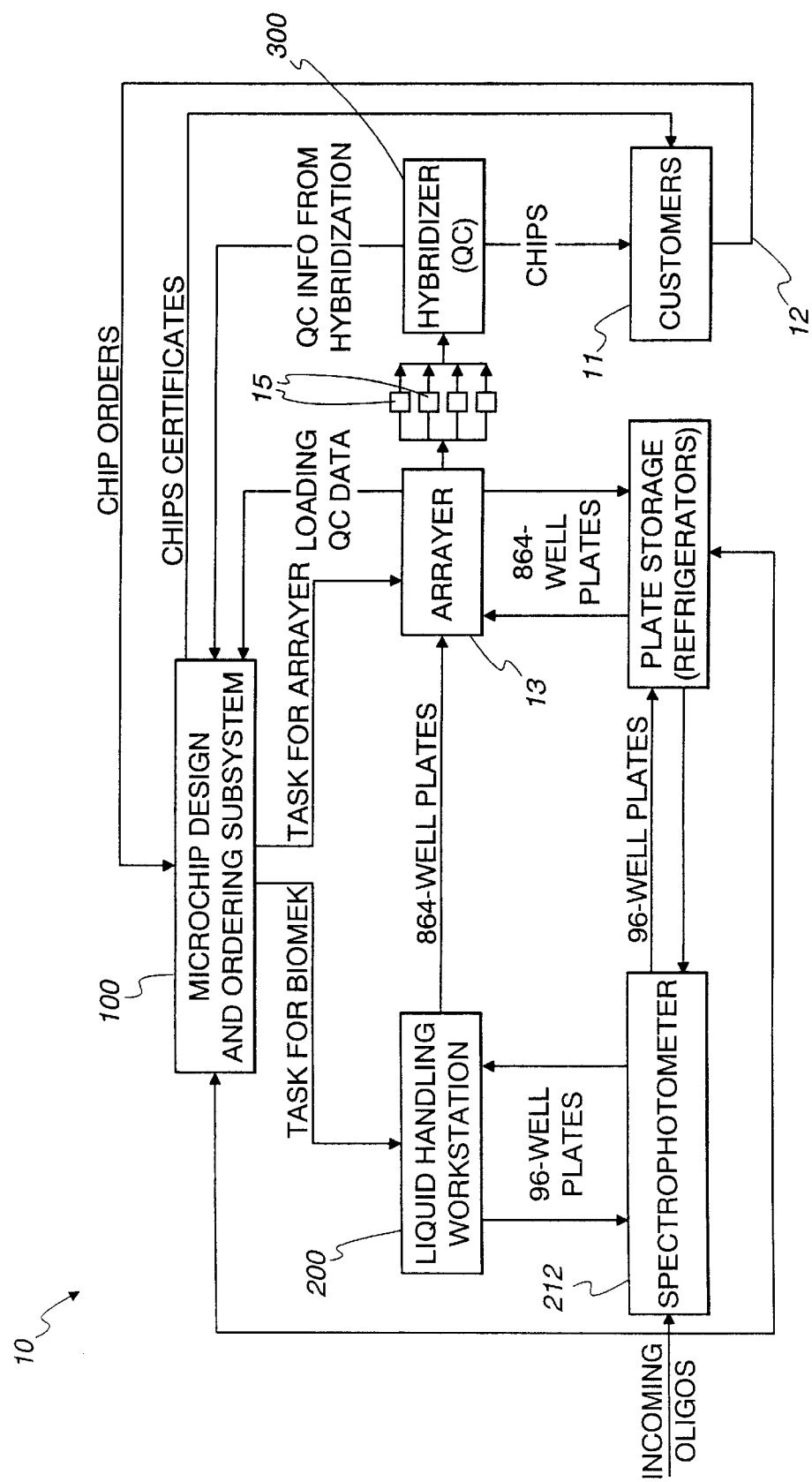
FIG. 1A is a flow chart of an exemplary system for producing micro scaled arrays of molecules, in accordance with features of the present invention.

A schematic diagram of the integrated subsystems in synergistic operation is designated in FIG. 1A as numeral 10. A customer-initiated order 12, from a remote location, begins the manufacturing process. A design/ordering subsystem 100 converts the customer's request to intermediate files containing information about chip layout, load amount and plate layout. For example, text files include a "chip layout.txt" file, a "load amount.txt" file and a "plate layout-.txt file".

The intermediate files are sent to a server where they are compiled by software and become task files to be acted upon by custom control software, designed, for example, using LabViewJ, of National Instruments, Austin, Tex. As such, a solutions-transferring subsystem 200 extracts desired oligonucleotides from an oligonucleotide reservoir 212 and transports the oligonucleotides at specific (i.e. addressable) positions on a blank gel array 15 via an arrayer 13. The quality control subsystem checks the transfer of solutions from the reservoir to the template matrix in real-time during the loading and transfer steps.

An end result of the manufacturing system is a substrate containing a matrix of molecules which are microscopic in size. Upon placement of the molecules in various addressable cells of the matrix, the molecules can be further manipulated, depending on the type of assay for which the matrix is to be utilized. Examples of such molecular manipulation can be found in U.S. Pat. Nos. 5,552,278 and 5,981, 734, both of which are incorporated herein by reference. The resulting matrix is either placed in refrigerated storage or else delivered to the customer 11 after a quality control check 300.

As more fully discussed infra, quality control can be carried out using two methods. In one method, image analysis can be used to compare before-loading and after-loading gel pad images, verifying that the oligonucleotide solution was successfully transferred to the gel pad. The second method for quality control uses four predetermined oligonucleotide sequences as an 'internal standard' to check gel pad loading and oligonucleotide hybridization.

Figure 1B:
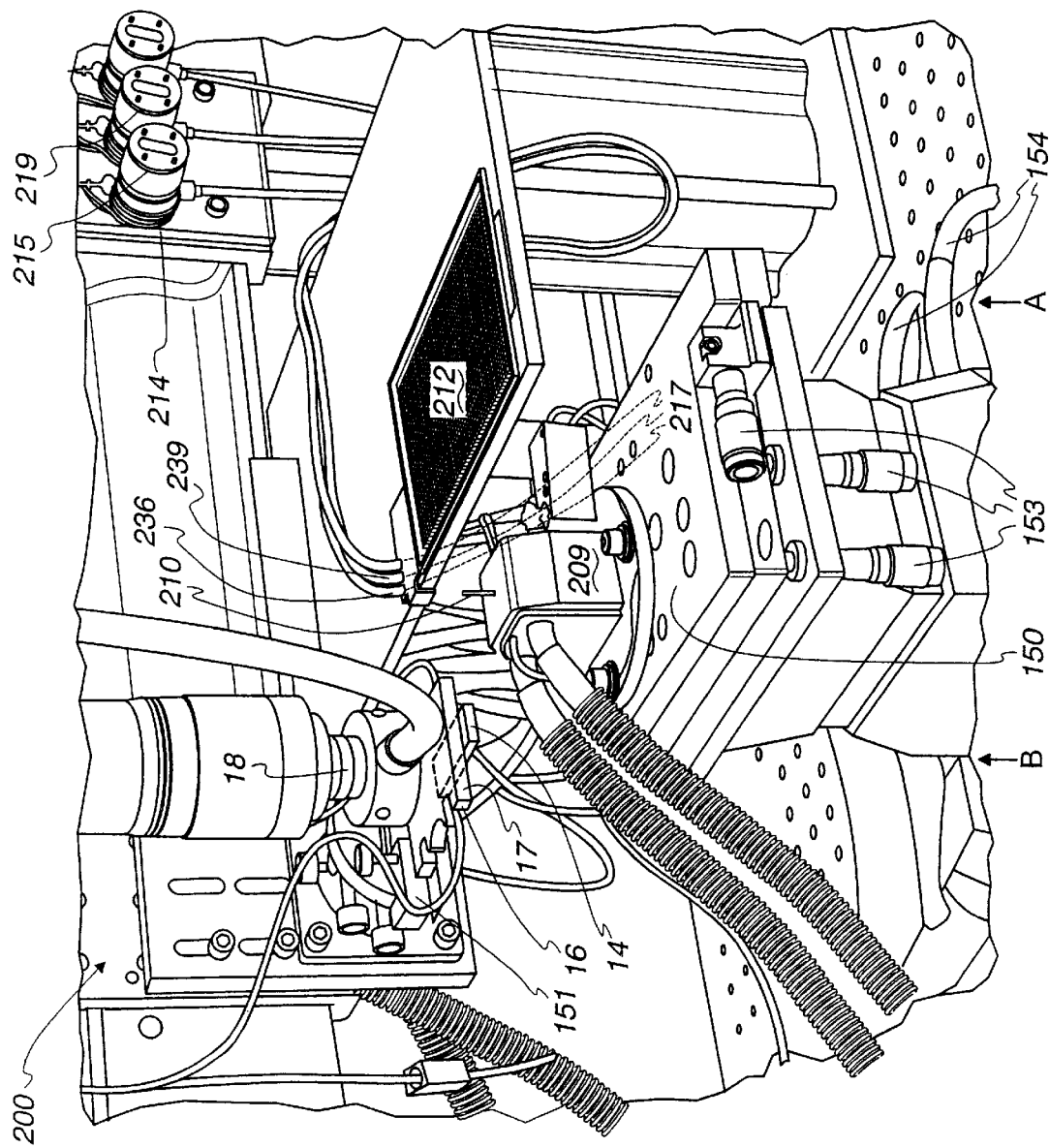
FIG. 1B is an elevated perspective view of the invented system, in accordance with features of the present invention.

FIG. 1B is an elevated perspective view of a preferred embodiment of the biochip manufacturing system, designated therein as numeral 200. The substrate-matrix construct is designated herein as a blank gel array 14. The blank gel array contacts a chip template holder 16 in a manner to reversibly secure the blank array to the holder for loading and quality control verifications. In this preferred embodiment, the blank array 14 is secured upside down and to a downwardly facing surface of the holder 16.

Juxtaposed above the holder 16 is a means 18 for visualizing individual cells (hereinafter referred to as gel pads) of the matrix. The visualizing means includes magnification capabilities, with the capabilities depending on the density of individual gel pads on the matrix. Typically, standard microscope configurations are utilized. Generally, magnifications of from approximately 10× to 240×are suitable.

A solution reservoir 212 serves as the feedstock with which individual gel pads of the blank gel array are loaded. A myriad of reservoir configurations can be utilized in this embodiment, for example as a two-dimensional array. However, for the sake of economics, a typical micro well plate, situated upside down, is preferred as the inverted reservoir configuration.

Figure 2A:
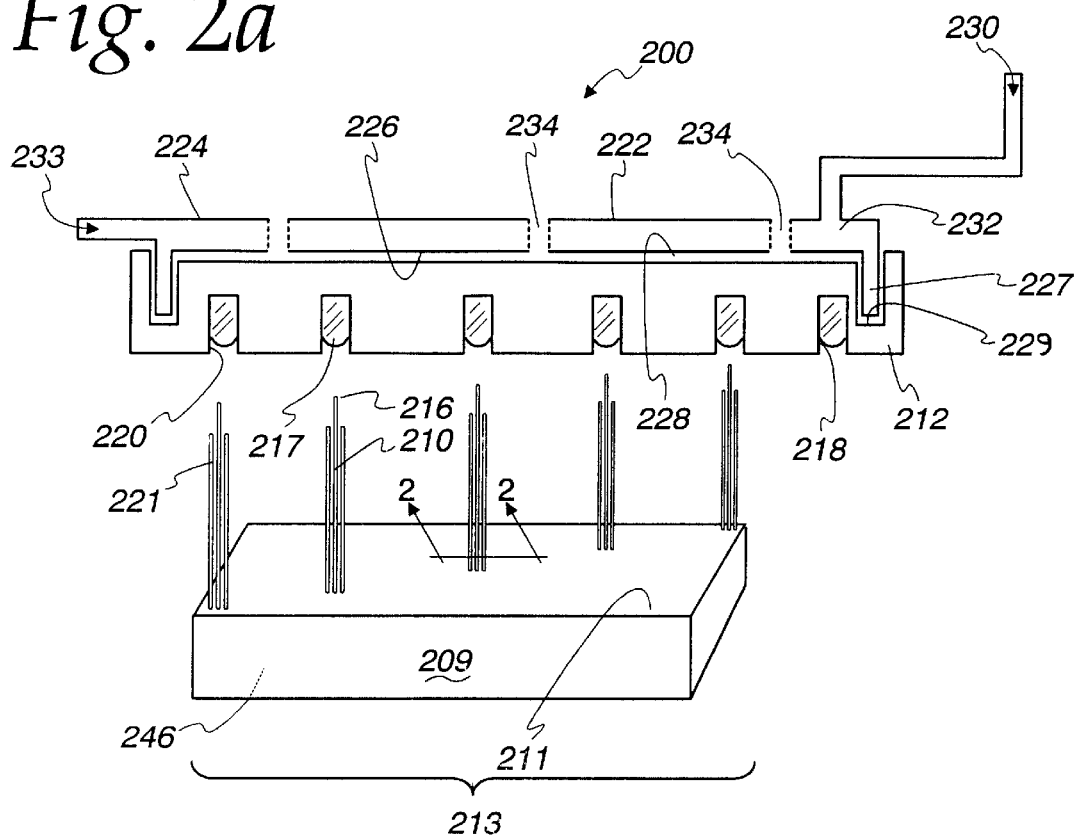
FIG. 2A is a schematic view of a solution transferring system, in accordance with features of the present invention.

As illustrated in FIG. 1B and 2A, a means for transporting solution from discreet, inverted cavities 218 also is provided. In the preferred embodiment, the transport means comprises a solid pin 210 or a plurality of pins arranged in an array 213 (which array 213 may be complementary to the array defined by the positions of the cavities 218. Each pin has a diameter suitable to be slidably received by each of the reservoirs 218. Natural adhesion forces cause the solution to reside on the pin for a time sufficient to allow for transfer of the solution to individual gel pads of the blank gel matrix 14. Each pin has a hydrophillic end 216 that contacts a solution in the reservoir. The vertical sides of each pin are hydrophobic, thus eliminating the possibility that the solution will form droplets on the side of the pin rather than remaining on the end. This results in an efficient and complete transfer of solution from the pin.

As more fully discussed infra, the temperature of the transport means must be suitable vis-a-vis the environment, to minimize evaporation or dilution during transport.

Another feature of the transport means is a platform 150 which facilitates initial positioning of the pin 210. This initial adjustment is facilitated via manually adjusted positioning screws 153.

The adjustment platform 150 rests upon and is supported by x-, y-, z-axis fine-positioning modules (not shown). Any fine positioning system capable of 0.1 micron accuracy is suitable. A myriad of systems are available, including those from Newport Corporation, of Irvine, Calif. The inventors utilized the (M)-PM500-88 x-y stage assembly and the (M)-PM500-1V Vertical Travel Mini-stage assemblies from Newport.

Generally, the fine positioning modules manipulate the harvesting pins to a first position "A" (at a predetermined x,y,z point) for solution harvesting and then at a second position "B" for solution deposition. The positioning means is typically, remotely actuated via software so as to streamline harvesting and deposition processes. The positioning means also aligns the pin or pin array with the washing subsystem so that each pin can be thoroughly washed and dried between rounds of solution transfer. The positioning software interacts with the fine adjustment modules via standard cabling 154, radio control, or infra-red linkage.

Solutions Transfer Detail

The invented system utilizes a unique oligonucleotide loading and transporting configuration. The solutions-transferring subsystem contains a set of temperature-regulated replaceable pins which function as liquid transfer devices for small quantities (0.1 to 10 nanoliters) of liquid. In the instant embodiment, the pins transfer oligo from the reservoir to a matrix pattern made of gel (e.g., polyacrylamide) or other suitable substrate.

FIG. 2A is a schematic depiction of the solutions transferring system 200. The system 200 comprises a plurality of harvesting pins 210 arranged in a pin array, a solutions reservoir 212 adapted to receive the pins 210, and a pin washing system 212.

A temperature control subsystem (discussed infra) regulates the temperature of a first end 216 of the pins 210. This temperature regulation prevents evaporation of solution 217, stored in the solution reservoir 212, during solution transport on the pin tip. The pin array is actuated by a robot, also discussed infra.

The temperature regulation feature of the solutions transfer subsystem is software-controlled using custom robotic control software. The software receives input data such as ambient temperature, dew point of ambient air, the temperature of the base of the array 213 of pins 210 and the temperature of the underside or bottom surface 246 of the array base plate 209. The software utilizes this data to regulate the temperature of the harvesting pins. The software calculations take into account the temperature gradient along the length of the harvesting pins so as to compensate for any difference between the base of the pin and the loading end 216 of the pins. A device for directing heat to or away from the harvesting means (via conduction) contacts the underside 246 of the array base plate. For example, a Peltier Element Cooling Plate (not shown) contacts the underside 246 of the array base plate to direct heat, via conduction, away from the array.

The monitoring of the various temperature parameters, and appropriate response of the robotics, is facilitated by the proportional integration differential algorithm program embedded in the software.

A myriad of conduits exist for inputting the above-discussed data points into the software, including, but not limited to electrically connecting temperature and dew point sensing means with the software's input. In this instance, the sensors provide real-time input to the software. Quality control data is acquired by the software from a CCD system mounted above the chip template. The optical system is generally manually aligned by the operator at the beginning of the manufacture of a biochip. This alignment also allows initial juxtapositioning of the pin array holder to the template.

Another input alternative is simply to observe each data point and key the data in at established intervals.

A salient feature of the solutions transferring system 200 is that the solutions reservoir actually consists of a plurality of inverted solutions cavities 218 making up the solutions reservoir 212. This feature obviates contamination of the solution 217 from ubiquitous and ever-settling, air-borne debris. The tips 216 of the harvesting pins are slidably received by depending openings 220 of these cavities 218.

A reservoir temperature control system is provided to keep the temperature of the solutions 217 in the cavities 218 at a predetermined temperature. For example, the temperature control system is suitable to maintain the solutions at a temperature at or near the ambient dew point.

The temperature control system comprises a heat sink 222 with a first surface 224 and a second surface 226. The interior of the heat sink is adapted to receive or otherwise contact a fluid capable of regulating the temperature of the heat sink. For example, in one embodiment, the heat sink comprises a contiguous internal cavity (not shown) which receives a thermofor, such as water or a water alcohol mixture, at a temperature sufficient to maintain the heat sink at a pre-selected temperature. The thermofor supply 230 is connected to an inlet 232 of the cavity to provide a means of ingress and egress for the water thermofor. Optionally, a separate means of egress 233 is provided to provide a continuous flow of the thermofor through the heat sink.

The second surface 226 of the heat sink contacts a bottom side 228 of the reservoir proximal to the bottom of the cavities 218 in a manner to maintain the temperature of the solutions 217 inside the cavities at a selected temperature.

While various configurations of the second surface 226 of the heat sink are suitable, those shapes which are complementary with the bottom side 228 of the reservoir are most preferable so as to maximize heat exchange. As such, when a standard micro-multiwell plate is utilized as the reservoir (such as a conventional 384 or 864-well plate), the second surface 226 further defines a depending lip 227 along its periphery which is adapted to be slidably received by a slot 213 which typically extends along the periphery of the bottom of those plates.

Optionally, to further maximize thermal exchange between the heat sink 224 and the solutions reservoir 212, a fluid saturated absorbent substrate is placed intermediate to the heat sink and reservoir prior to the assembly. To accommodate seepage from the absorbent substrate, the heat sink further defines transverse apertures 234, through which the saturating fluid can permeate upwardly. Care is taken to avoid intersection of the apertures with the internal fluid passage of the heat sink.

Fluid flows through the heat sink via inlet port 232 and outlet port 233 at a continuous rate. Alternatively, computer-actuated valves regulate the flow of fluid through the inlet 232, with the flow rate and fluid temperature selected depending on the temperature of the sink 222.

Pin Holder Assembly Detail

The harvesting pins are arranged to maximize efficiency of the solution loading and unloading process. As such, when a plurality of pins are utilized, the pins are arranged to be simultaneously slidably received by a plurality of inverted solution wells 218 during each harvesting interaction.

After the solution is harvested by the pins, the pin transport mechanism accurately positions the pin array so that each pin is aligned with an empty cell (i.e. gel pad) of the matrix (i.e. blank gel array 15). It is a feature of the pin array that each row of pins is spaced wider apart than the rows of gel pads on the chip. The relationship between the pin spacing and the gel pad spacing can be modified. The number of gel pads that can fit between the pin rows is preferably set to be an integer. This value is termed the "interlace factor".

Upon alignment, the tips of the pins comprising the pin array are commanded to simultaneously contact the fluid onto their assigned pads on the blank chip. The pins are positioned at a distance sufficient to cause liquid, dwelling at the tip, to adhere or otherwise transfer to the surface of the gel pad opposing each pin. Preferably, the pin-pad distance is adjusted to ensure that the tips of the pins do not penetrate the gel pad matrices on the blank chip. This alignment also guarantees that the tips of the pins of the pin array are in correct alignment with the washing subsystem and the reservoir.

After loading one row of gel pads, the position of pin array is automatically readjusted so it now can load the next row of gel pads. This process continues in a serial fashion until all of the gel pads are loaded, using the interlace factor to determine the number of moves necessary to complete the loading of the chip.

Figure 2B:
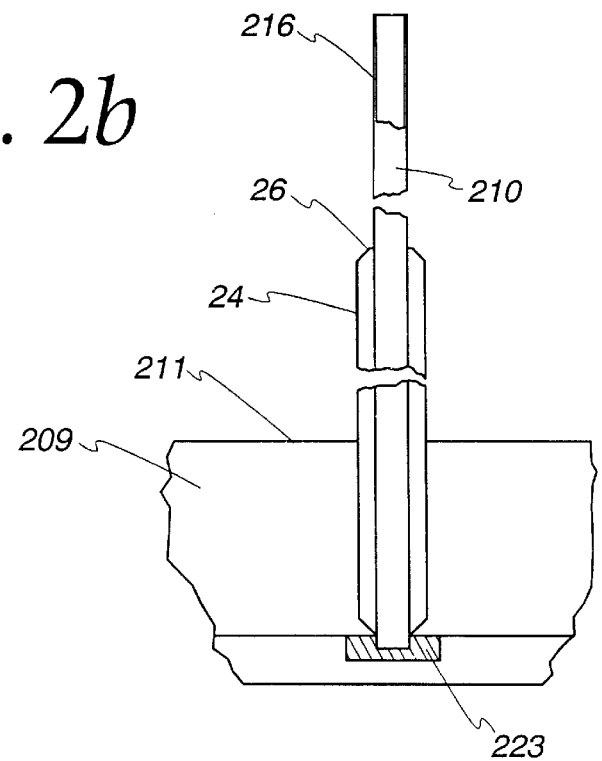
FIG. 2B is a sectional view of FIG. 2A taken along line 2—2.

Inasmuch as the pins have diameters on the order of 50 to 500 microns, buckling or other similar disfigurement of unsupported or non-reinforced pin tips can occur with repeated matrix contact. To prevent such disfigurement, and as depicted in FIG. 2A, the pin 210 is nested in a support sleeve 221, which in turn is connected to the pin array base plate 209. As more clearly depicted in FIG. 2B, a first low temperature melting substrate such as solder 223 or resin connects the pin 210 to the base plate in a thermally reversible manner. Prior to final solidification, the low temperature melting substrate allows the subtle elasticity necessary to confer axial movement of the pin along the interior space of the sleeve 24 during initial pin/matrix cell contact. This confers a co-planarity of all of the pin tips. In other words, the axial movement conferred by the molten substrate allows all of the pins in the array to "seat" to the same height during initial transfer operations, thereby conferring maximum uniformity of solution transfer volumes during matrix cell loading in later cycles. A second low temperature melting substrate, having a higher melting temperature than the first thermally reversible substrate, is present in the annular space (FIG. 2B) to maintain the pin in a vertical position, during the height adjustment process. In cases where individual pins are severely damaged, those pins in the array are replaced.

Chip Holder Detail

Accurate placement of loading pins onto blank gel pads is fundamental to maintaining superior quality control in biochip manufacturing processes. The chip template holder 16 provides a means for simultaneously aligning the chip with both the loading pins and the quality control subsystem. This holder is configured to hold chips of a variety of standard sizes and template patterns.

A feature of the chip holder is its ability to facilitate optical access of the quality control subsystem to the chip. As such, in instances where image-loading indices are utilized to confirm proper gel pad loading, the chip holder should allow visual communication between the quality control subsystem and the chip containing the matrix. A substantially transparent chip holder is appropriate, whereby the chip holder is comprised of a transparent material (such as glass or clear plastic), or at least of a material affording suitable transparency so as to allow optical communication between the quality control subsystem and the chip.

As illustrated in FIG. 1B, when solid transparent material is used as the chip holder, the chip holder 16 is configured as a generally planar slab having a downwardly facing surface 17 sufficient in surface area to communicate with a substantially planar surface of the substrate defining an underside of the blank chip 14. Maximum contact is desired to optimize immobility between the two substrates. Immobilization between the blank chip 14 and chip holder 16 is further enhanced in a myriad of ways, including, but not limited to such reversible attachment means as a hook-and-pile arrangement (such as Velcro7 fastener), a mechanical clip arrangement, or negative pressure. Furthermore, the chip holder 16 is removably attached to a tilt platform 151 (also available from Newport Corp. Irvine, Calif. as M37**) so as to allow the chip holder, and thus the chip, to be adjusted to the horizontal surface by movement in the x, y, and z planes.

Figure 3:
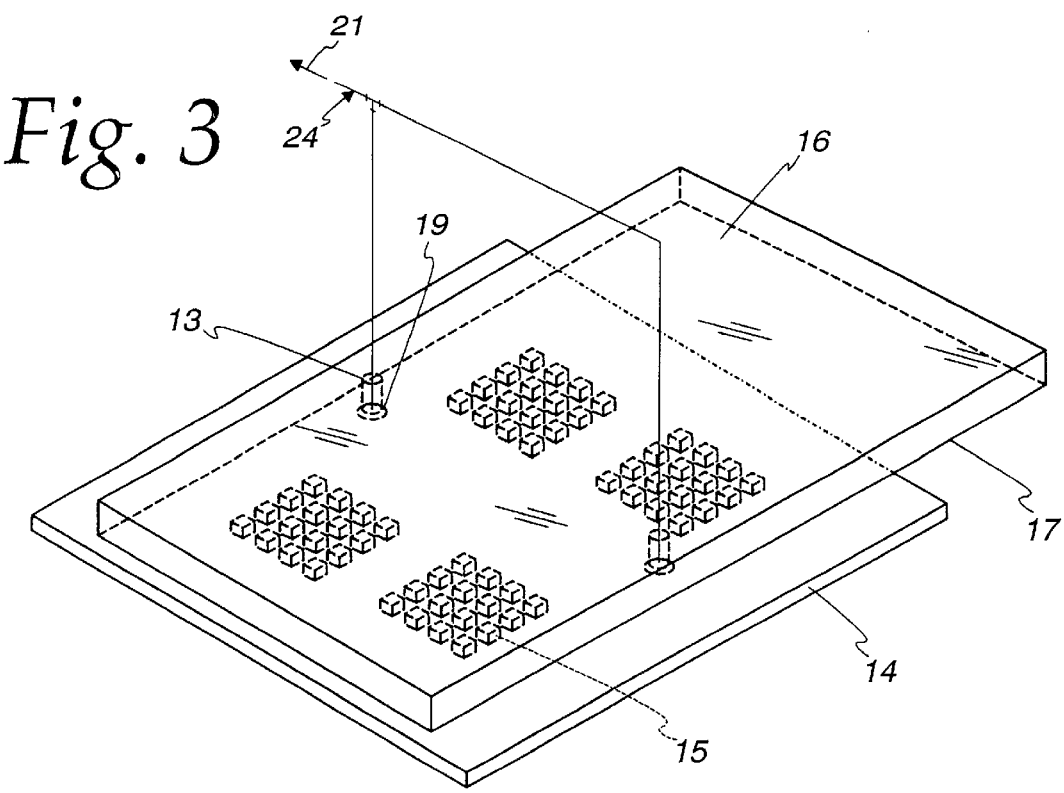
FIG. 3 is a perspective view of an array positioning device, in accordance with features of the present invention.

Preferably, and as depicted in FIG. 3, negative pressure is utilized to immobilize the chip to the holder 16. In this arrangement, portions of the chip holder 16 define an air conduit 13, or plurality of air conduits, each of which has an end 19 which terminates at the downwardly facing surface 17 of the holder. Negative pressure 21 is induced in the conduit or conduits at a point 24 remote from the conduit termination end, via application of a vacuum. When, during application of the vacuum, the underside of the biochip 14 contacts a region of the downwardly facing surface 17 of the holder defining the conduit termination end or ends, the biochip adheres to the surface 17.

When the biochip 14 is placed over the termination points during negative pressure conditions in the conduit, the biochip 14 adheres to the underside 17 of the chip holder 16. As such, the matrix 15 comprising a plurality of solution receptacles, (i.e., the array of gel pads) are co-planar with the chipholder and gel pads and face downwardly to provide access to the solution loaded pins 210.

Pin Washing Detail

A washing subsystem 214 cleanses the pins of the pinarray holder assembly at the end of each solutions-harvesting and -deposition cycle. This ensures that no cross-contamination of solutions occurs, either during their harvesting or during their deposition.

The washing subsystem cleanses and dries the entire length of each pin in the pinarray holder. A salient feature of the washing process is the utilization of a gravity fed washing stream 215 so that the washing solution cascades downwardly from a point of emanation 217 upon the upwardly directed pins 210. Another feature of the washing process is the provision for a vacuum means to immediately remove spent washing solution to prevent a build-up of spent washing solution on and adjacent to the pin array.

Figure 4:
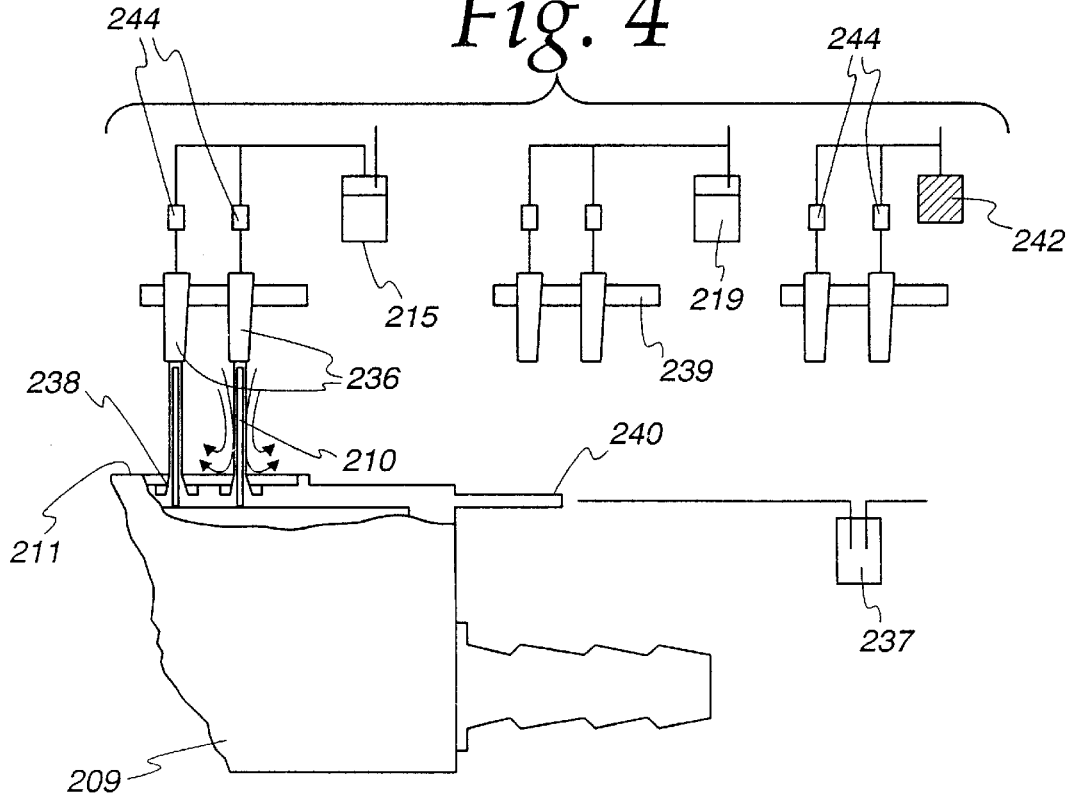
FIG. 4 is a schematic depiction of a washing system, in accordance with features of the present invention.

A schematic diagram of the washing process is depicted as numeral 214 in FIG. 4. While a myriad of different solution types and configurations can be utilized for pin cleansing operations, for the sake of illustration a two solution cleansing process is detailed herein. As a first step, the pins 210 are positioned first below nozzles 236 for cleansing with any water miscible solution including water, detergent, weak acid and weak base. Once the cascading first cleaning fluid 215, in this instance a detergent, passes over the pins 210, the fluid is evacuated from the surface 211 of the pin array base plate via a negative pressure evacuation system 237. Regions of the surface forming apertures 238 serve to facilitate fluid communication between the base of the pins and the negative pressure evacuation system 237. A fluid evacuation conduit 240 intermediate to and connecting the apertures 238 to the evacuation system 237 serves as a means for transporting any draining cleansing fluid from the base of the pins to the evacuation system.

After the pins are subjected to cleansing by the first solution 215, the pins are positioned under a second set of nozzles 239 to be rinsed by a second fluid 219. Any solvent that evaporates quickly leaving no residue is suitable for rinsing, including, but not limited to low vapor pressure solvents, e.g. alcohol and water. The negative pressure fluid evacuation means 237 described above is also utilized in this second cleansing step.

Ultimately, the now-cleansed pins are dried by their exposure to pressurized drying fluid, 242, examples of such fluid including, but not limited to low vapor pressure solvent streams, air, nitrogen, and other inert fluids.

Flow rates and volumes of the various cleansing and drying fluids and gasses are controlled by flow valves 244.

Instead of separate nozzles for each cleansing and drying stream, a single nozzle station can be utilized with valves selectively actuated, depending on the fluid or gas desired.

Surprisingly and unexpectedly, the inventors have found that cleansing fluid flow rates can be varied to optimize the efficiency of pin cleaning. Specifically, the cleansing solutions are released so as to form turbulence at pin tip/cleansing fluid contact points. This turbulence adds a mechanical component to the solvation effect of the cleansing fluids so as to assure optimal cleaning. Also, the turbulence induces the formation of entrapped air bubbles in the cleansing fluid, further enhancing cleansing action. The formed air bubbles decreases the frictional force of the cleansing fluids, thereby increasing flow of the fluids over the pin lengths and through the evacuation apertures 238 and conduits 240.

Positioning Subsystem Detail

The positioning subsystem regulates the physical position of the movable elements of the invented system with respect to the stationary elements. For example, the moveable pins 210 and their moveable pin base plate 209 must be positioned underneath the depending solutions cavities 218 of the solutions reservoir 212 to begin harvesting of specific solutions. Then, each pin in the array must be positioned under the blank chip 14 for solutions deposition in gel pads particularly earmarked for the solution contained on the pin. Finally, the pins must be juxtaposed to a washing substation for cleaning in preparation of the next harvesting task.

Movement of the pinarray holder is along the x, y, and z axis. In light of the high density packing of the reservoirs and even more so the blank chip gel pad pattern, the pinarray holder movements are necessarily precise. Given the variations in geometry that occur in the configuration of the blank chip pattern 15, that pattern becomes the alignment key for the placement of the pinarray holder element during both the loading and washing portions of the manufacturing cycle.

The manufacturing cycle dictates a predetermined, logical progression of move-ments by the pinarray holder. The movements are controlled by a computer system comprising software driving motion control hardware. The motion control hardware drives a first and second motorized linear stage so as to position the pinarray holder anywhere in the plane defined by the x-axis and y-axis.

As discussed supra the invented system provides a means for actuating the pin-array along the z-axis. One such means is an air-damped solenoid. Alternatively, movement along the z-axis is effected via a third motorized linear stage, vertically arranged. As with the first two linear stages, this third stage is electrically connected to the motion control hardware.

Coarse or manual alignment of the pinarray holder is initially made prior to actuation of the computer driven positioning system. Alignment of the x- and y-axis of the pin holder array is made with the x- and y-axis of the positioning system. The system allows for manual alignment of the pinarray holder with positions on the blank chip inasmuch as alignment can be followed visually with the aid of the microscope utilized in visual quality control steps.

Also, the distance between the tips of the pins and the gel pad matrix is adjusted, as is the parallelism of the planes defined by the tips and the matrix. As noted supra, the distance is adjusted to ensure that the tips of the pins do not penetrate the gel pad matrices on the blank chip. Alignment of the x- and y-axes of the biochip matrix with the x- and y-axis of the overall positioning system also is made.

Initially, the longitudinal axes of the cavities 218 should be coaxial to the pins. This alignment can be rather coarse and can be carried out once during each run, usually at the beginning.

QC Control Subsystem Detail

Quality control of the matrix manufacturing process is enhanced via a visual image indexing system. The system compares images during various steps of a chip-loading operation to verify the loading efficiency for each cell on the matrix. Differences between indexed visual images of an empty cell and a loaded cell are compared to determine if adequate solution volumes are deposited in the cell. If the comparison indicates inadequate solution deposition, the system performs a reloading step for that particular cell until an empty-/loaded-cell image comparison signifies adequate solution deposition.

A database archive of indexed images will allow for the retrieval of images so that verification of adequate solution loading can be confirmed at,any time during the manufacture and life of the microchip. An advantage of this process is the real-time monitoring of chip manufacture so as to reduce defect rates to a minimum.

Elements in the imaging indexing system include an optical monitoring means combined with a control system. The optical monitoring means further comprises a matrix-image magnification device (such as a lens), an image acquisition device (such as a CCD camera), and a means for accurately aligning the magnification device and image acquisition device with individual matrix cell positions (i.e., x- and y-axis coordinates). This alignment means typically involves mounting the magnification device and image acquisition device in tandem and above the plane of the substrate containing the matrix. The alignment means is capable of scrutinizing each individual cell. As such, x-axis and y-axis movement of the optical monitoring system vis-a-vis the substrate containing the matrix is precise with a repeatability of +/−2 microns.

The control system provides a means for converting the optical image to a digitized file for future data processing and reference.

The basic principle for ensuring adequate cell loading by image comparison comprises the following steps:

1) Obtaining the image (A) of an empty cell before loading.
2) Obtaining the image (B) of the same cell just after loading.
3) Optional pre-processing the images A and B taken at steps (1) and (2).
4) Comparison of images A and B.

Comparison of images A and B can be carried out in different ways. The following sequence represents one possible method: a) subtraction of images A and B resulting in differential image C; b) post-processing of the differential image C; and c) comparison of the post-processed image data with the criterion for successful loading.

Specifically, the images for an empty cell and for a loaded cell are first smoothed to reduce the impact of noise, then brightness and contrast filters are applied (if necessary) to both images using the same filter parameters. Next, filtered images for loaded and unloaded cells are subtracted pixel by pixel and the resulting differential image is integrated pixel by pixel (all pixel values are added together). The resulting integral value (I) represents the difference between a loaded and unloaded cell. This value is then compared to the threshold value (T) that is known experimentally to be a criterion of successful loading. If the image difference value (I) is more or equal than the threshold (T), it indicates adequate loading. If the image difference value (I) is less than the threshold (T), it indicates inadequate loading. If this occurs, the suspected fault is subject to further analysis and perhaps reloading. Besides smoothing, contrast and brightness filters, other image processing techniques can be used, such as edge detection. Alternatively, instead of integration of the differential image, the differential image can be compared to a series of images representing various levels of loading.

This whole algorithm can be implemented in real-time (cell loading; image analysis; if fault detected, reload; if successful, proceed to the next cell), or it could be implemented as a post-processing of image data after the whole chip has gone through the loading process. In the latter case, the image data for each cell collected during the chip loading is analyzed. Suspected faults are further examined and a task file is then generated to reload faulty cells retrospectively.

Aside from image comparison, other methods for ensuring adequate cell loading can be realized, including via heat conductance variances (i.e. temperature changes to the loading pin 210) before and after loading, and electrical conductance variances.

Figure 5:
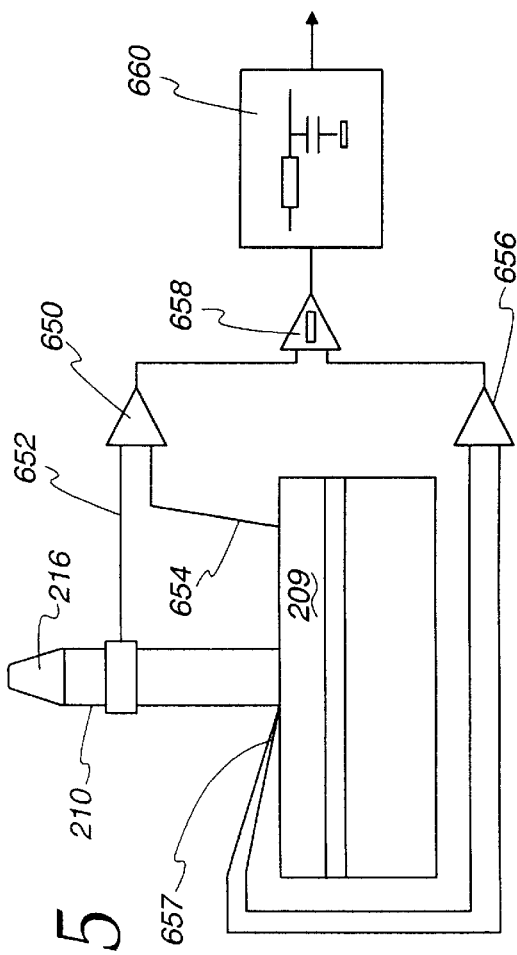
FIG. 5 is a schematic depiction of a heat-conductance quality control system, in accordance with features of the present invention.

The heat conductance variance method detects loading of a solution onto a cell by measuring the rise in temperature, which occurs at the end 216 of the pin 210 at the moment of solution transfer from the pin to the cell. Changes of 0.1° C. can be detected. FIG. 5 is a schematic diagram of this quality control method. A first thermocouple 650 is electrically attached to the tip 216 of the pin via a first electrical conduit 652. The first thermocouple 650 also is electrically attached to the pin array base plate 209 via a second electrical conduit 654. A second thermocouple 656 has both of its leads 657 attached to the base of the pin 210. The difference in electrical signal between the first thermocouple 650 and second thermocouple 656 is due to thermal differences between the pin tip 216 and its base. This difference is processed through signal conditioning modules 658 for digital processing 660. Suitable thermocouple modules are the 5B47T Modules, manufactured by Analog Devices of Norwood, Mass.

A third method for determining loading completion is by measuring the electrical conductance of the cell-site, before and after loading. This difference is then compared to a table of values indicating various degrees of loading.

Operation Detail

The position algorithm embodied in the robotics driving software manipulates the various elements of the manufacturing process in the following manner:

First, the pin-array is aligned with the washing subsystem, the chip holder, and the solutions reservoir. Next, the pinarray is manipulated using a three-point alignment procedure along the x- and y-axes vis-a-vis the gel pads on the blank chip. A single gel pad on the blank gel chip is designated as position 0,0.

During the solution harvesting and deposition procedures described infra, the pin tips are maintained at a temperature depending on the ambient humidity and temperatures. The details of this temperature maintenance are provided supra. As a first step in the loading procedures, the pinarray holder is aligned with the x- and y-coordinates corresponding to the solutions residing in the solutions reservoir, which the user desires to harvest. The pinarray holder is manipulated vertically and upwardly, up to a safety point, to a position sufficient to make contact of the tips with the solutions in the reservoir. After loading, via adhesion of the solution to the pin, the pinarray holder is lowered along the z-axis and positioned at certain x-y coordinates of the blank chip gel pads. The corresponding x-y coordinates on the biochip matrix often are those specified by the customer. As noted above, the x-y coordinates do not necessarily have the same matrix cell address as those reservoir solution cavities containing the desired solution. Rather, the pins load solution onto the blank gel pads in the pre-determined interlaced fashion.

The pinarray holder is actuated to travel along the z-axis until the solution carried on the tips of the pinarray holder contacts the matrix gel pads of the biochip with sufficient force and for a time sufficient to transfer the solution from the tips to the cells. After loading, the array is lowered and returned to the washing sequence outlined above.

Figure 6:
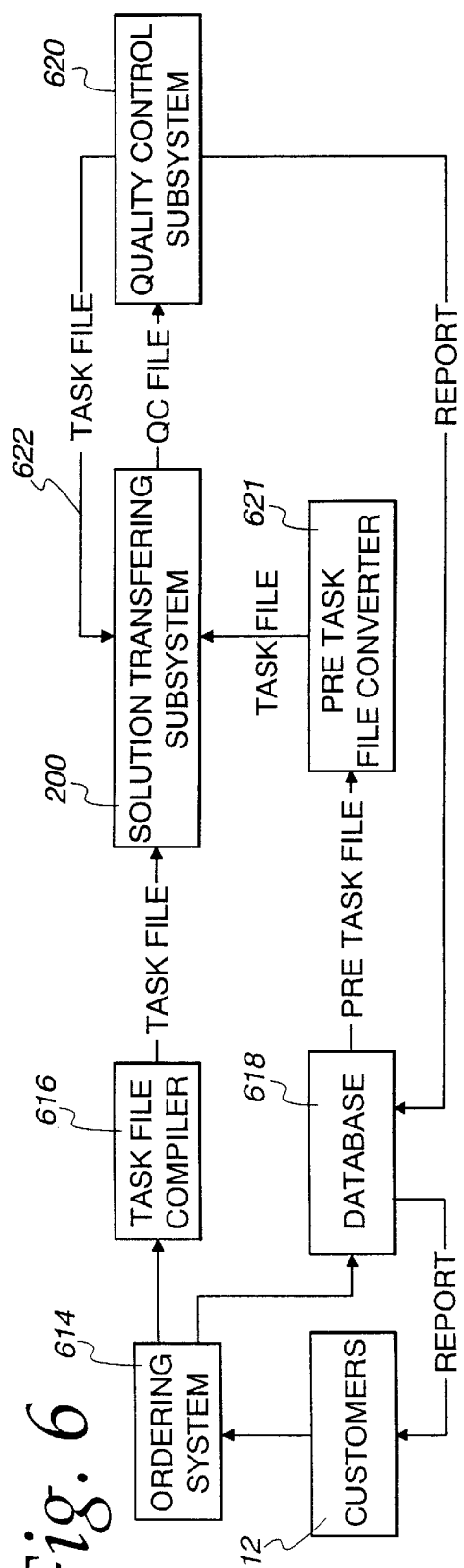
FIG. 6 is a flow chart of the data flow of the automated process, in accordance with features of the present invention.

An advantage of the biochip manufacturing process is that the entire procedure can be designed, directed, and actuated by a third party 12. In one scenario, as depicted in FIG. 6, the customer 12 e-mails an order and even stipulates the placement of desired solutions at particular gel pads on the blank chip. Further, the third party has the option of specifying his own gel pad array pattern.

An order support server 614 transforms the order files into taskfile instructions via a Task File Compiler 616 for the manufacturing robot to execute. In this first scenario, the customer manipulates a "plate file" and "chip order" file to create his customized biochip.

In another scenario, a customer may just desire to provide information regarding the different types of oligonucleotides on a chip, with oligonucleotide location on the biochip and origin of oligonucleotides selected by the biochip manufacturer A solutions reservoir database 618, in this instance designated as the "plate file", contains three interactive spreadsheet tables: "plate info" to designate the type of reservoir plate containing the chemicals to be harvested, plate layout, and solutions list. The "plate info" table contains such information as plate ID number, type of plate, plate manufacturer, number of rows (x-axis) and columns (y-axis), customer ID, purpose, and the date the plate was created.

The "plate layout" table contains information and well location of individual solutions. Individual solutions are designated by a solution ID number. Indexed with each solution number in the solutions list table is information such as sequence of each solution, the concentration of the molecule, buffer, the date the molecule was synthesized, additional comments such as organism or origin, and length of molecule.

The chip order file contains separate tables including "order info", "clusters layout", "chip layout", and "load amounts." The "Order info" table allows the customer to enter their ID, the array or biochip ID, the order ID, and proposed purpose of the chip.

The "clusters layout" table contains the layout of the clusters of arrays. It also indicates markings on the microchip that orients the customer as to which side of the glass microchip contains the array.

The "chip layout" table contains the desired placement of the solutions in the final biochip. The solutions are designated by a solution ID, as discussed in the "Solutions List" portion of this specification.

The "load amounts" table is an active interface to apprize the manufacturing process as to the amount of solution to be loaded on each gel pad in the template.

As discussed supra, during robotic manufacture of the biochip via utilization of the solution transferring subsystem 200, described supra, the loading process is captured by a quality control subsystem 620 in an indexed format. This QC subsystem 620 also performs feedback corrections 622 when a gel pad (defining a cell in the biochip matrix) is not loaded properly. These corrections also are archived in the quality control files associated with each biochip's manufacturing history.

A pretask file converter 621 converts instructions by third parties into an acceptable format for actuation by the solution transferring subsystem.

While the invention has been described with reference to details of the illustrated embodiment, these details are not intended to limit the scope of the invention as defined in the appended claims.

The embodiment of the invention in which an exclusive property or privilege is claimed is defined as follows:

1. A device for producing microscopic arrays of molecules, the device comprising:
    a) a plurality of inverted cavities containing solutions;
    b) an upwardly extending pin slidably received by each of said inverted cavities for extracting solutions from the inverted cavities;
    c) a means for depositing the extracted solutions onto a location on a matrix; and
    d) a means for verifying that the solutions are deposited onto the location on the matrix.

2. The device as recited in claim 1 further comprising a means for maintaining the solution at a temperature during extraction and deposition.

3. The device as recited in claim 1 wherein the verifying means comprises comparing an image of an unloaded location to the location containing deposited solution.

4. The device as recited in claim 3 wherein the image is digitized.

5. The device as recited in claim 1 wherein the verifying means compares an image of an unloaded location to the loaded location during loading.

6. The device as recited in claim 1 wherein the location faces downwardly.

7. The device as recited in claim 1 wherein the verifying means further comprises a means for measuring a temperature difference in the extracting/depositing means during deposition.

8. The device as recited in claim 1 wherein the verifying means further comprises a means for comparing the electrical conductance of the location containing deposited solution with the location not containing deposited solution.

9. A process for producing a microscopic array of molecules, the process comprising:
    a) providing a plurality of inverted solution cavities, wherein each cavity contains a solution containing a different molecule;
    b) using an upwardly extending pin to extract each solution from its inverted cavity, wherein the pins are slidably received by the cavities;
    c) loading each extracted solution at a predetermined position in an array; and
    d) verifying that each molecule is loaded onto its respective position in the array.

10. The process as recited in claim 9 wherein the step of providing a plurality of cavities further comprises maintaining the molecules at a selected temperature.

11. The process as recited in claim 9 wherein the step of extracting the solution further comprises contacting the solution with a transfer vehicle which is maintained at a selected temperature.

12. The process as recited in claim 9 wherein the cavities each face downwardly.

13. The process as recited in claim 9 wherein the step of verifying further comprises:
    a) supplying an index of images showing various levels of loading of the solution at the position;
    b) observing the level of deposition of the solution at the position; and
    c) comparing the observed level with the index to determine the extent of loading of the deposited solution.

14. The process as recited in claim 13 wherein the step of supplying an index further comprises comparing the difference between an indexed image of an empty position to an indexed image of a loaded position.

15. The process as recited in claim 9 wherein extraction occurs through the use of a robotic mechanism.

16. The process as recited in claim 15 wherein the step of extracting and loading each molecule further comprises:
   a) choosing the particular position from a position location grid; and
   b) choosing a concentration of molecule to be loaded to the position from a concentration grid, wherein the location grid and the concentration grid are input nodes for software which controls the robotics.

17. The process as recited in claim 16 wherein the grids are physically remote from the cavities.

18. The process as recited in claim 9 wherein the solution is extracted in the direction of gravity.

19. The process as recited in claim 9 wherein the position of the plurality of inverted solution cavities faces downwardly.

20. The process as recited in claim 9 wherein the verifying is done visually.

21. The process as recited in claim 9 wherein the verifying is based on temperature differential.

22. The process as recited in claim 9 wherein the verifying is made via a differential of impedance of the position.

23. The device as recited in claim 1 wherein the pin is a plurality of pins.

24. The process as recited in claim 9 wherein the upwardly extending pin is a plurality of upwardly extending pins.

25. The device as recited in claim 1 wherein the pin has hydrophobic vertical sides and a hydrophilic tip.

26. The device as recited in claim 1 wherein the pin is solid.

27. The device as recited in claim 25 wherein the transported solution is relegated to the tip of the pin.

28. The process as recited in claim 9 wherein the pin has hydrophobic vertical sides and a hydrophilic tip.

29. The process as recited in claim 9 wherein the pin is solid.

30. The process as recited in claim 28 wherein the transported solution is relegated to the tip of the pin.

* * * * *